(12) United States Patent
Chen et al.

(10) Patent No.: US 11,217,568 B2
(45) Date of Patent: Jan. 4, 2022

(54) LED FILAMENT ASSEMBLY AND LAMP INCLUDING THE SAME

(71) Applicant: XIAMEN ECO LIGHTING CO. LTD., Xiamen (CN)

(72) Inventors: Yanbiao Chen, Xiamen (CN); Qiyuan Wang, Xiamen (CN); Huiwu Chen, Xiamen (CN); Hongkui Jiang, Xiamen (CN); Liangliang Cao, Xiamen (CN); Yongshu Zheng, Xiamen (CN)

(73) Assignee: XIAMEN ECO LIGHTING CO. LTD., Xiamen (CN)

(*) Notice: Subject to any disclaimer, the term of this patent is extended or adjusted under 35 U.S.C. 154(b) by 0 days.

(21) Appl. No.: 17/240,105

(22) Filed: Apr. 26, 2021

(65) Prior Publication Data

US 2021/0249387 A1    Aug. 12, 2021

Related U.S. Application Data

(63) Continuation of application No. 16/718,998, filed on Dec. 18, 2019, now Pat. No. 11,018,119.

(30) Foreign Application Priority Data

Dec. 29, 2018  (CN) .................. 201822275030.X

(51) Int. Cl.
*F21K 9/232* (2016.01)
*H01L 25/075* (2006.01)
*H05K 1/18* (2006.01)
*F21V 19/00* (2006.01)
(Continued)

(52) U.S. Cl.
CPC .......... *H01L 25/0753* (2013.01); *F21K 9/232* (2016.08); *F21V 19/0025* (2013.01); *H05K 1/189* (2013.01); *F21Y 2113/13* (2016.08); *F21Y 2115/10* (2016.08); *H05K 2201/10106* (2013.01)

(58) Field of Classification Search
CPC ..... H01L 25/0753; H05K 1/189; F21K 9/232; F21V 19/0025
See application file for complete search history.

(56) References Cited

U.S. PATENT DOCUMENTS

2014/0268779 A1*  9/2014  Sorensen ............... F21K 9/232
                                                  362/249.06
2017/0130906 A1*  5/2017  Jiang .................... F21K 9/232
(Continued)

*Primary Examiner* — Evan P Dzierzynski
(74) *Attorney, Agent, or Firm* — Chun-Ming Shih; Lanway IPR Services

(57) ABSTRACT

An LED filament assembly includes a frame, a first electrode disposed on a first end of the frame, and a second electrode disposed on a second end of the frame. The LED filament assembly includes a first group of LED chips capable of emitting a first color, a second group of LED chips capable of emitting a second color, and a third group of LED chips capable of emitting a third color. The first group of LED chips is disposed on the frame along a longitudinal axis, connected in series, and electrically connected to the first electrode and the second electrode. Similarly, the second and the third group of LED chips are also disposed on the frame along the longitudinal axis, connected in series, and electrically connected to the first electrode and the second electrode. A lamp including such an LED filament assembly is also disclosed.

16 Claims, 10 Drawing Sheets

(51) Int. Cl.
 *F21Y 113/13* (2016.01)
 *F21Y 115/10* (2016.01)

(56) References Cited

U.S. PATENT DOCUMENTS

2017/0336038 A1\* 11/2017 Kim ..................... H01L 33/507
2018/0112831 A1\* 4/2018 Huang ................ H01L 25/0753

\* cited by examiner

11,217,568 B2

LED FILAMENT ASSEMBLY AND LAMP INCLUDING THE SAME

RELATED APPLICATION

The present application is a continued application of U.S. patent application Ser. No. 16/718,998.

FIELD

The present invention is related to an LED filament assembly, and a lamp including the LED filament assembly.

BACKGROUND

In the past, the LED light sources have to be equipped with optical components, such as lens, so as to provide satisfactory illuminance and large illumination area. However, such optical components may affect the lighting effect, and may lead to higher power consumption. The LED filament may provide 360° full-angle illumination without the need of additional optical components. Not only the full-angle illumination may be accomplished, but also the lighting performance is excellent.

Conventionally, the LED filament may be a monochromatic white filament, monochromatic LED filament, or dual-color high and low color-temperature LED filament. It can be understood that the color is monotonous, and various colors and multi-color temperature adjustment cannot be realized.

SUMMARY OF INVENTION

In one aspect, the LED filament may realize multi-color solution and multi-color temperature adjustment.

In some embodiments, the LED filament assembly includes a frame, a first electrode disposed on a first end of the frame, and a second electrode disposed on a second end of the frame. The LED filament assembly also includes a first group of LED chips capable of emitting a first color, a second group of LED chips capable of emitting a second color different from the first color, and a third group of LED chips capable of emitting a third color different from the first color and the second color. The first group of LED chips is disposed on the frame along a longitudinal axis, connected in series, and electrically connected to the first electrode and the second electrode. Similarly, the second group of LED chips is also disposed on the frame along the longitudinal axis, connected in series, and electrically connected to the first electrode and the second electrode. And the third group of LED chips is also disposed on the frame along the longitudinal axis, connected in series, and electrically connected to the first electrode and the second electrode.

In some embodiments, the first group of LED chips is capable of emitting red light, the second group of LED chips is capable of emitting green light, and the third group of LED chips is capable of emitting blue light.

In some embodiments, the first group of LED chips, the second group of LED chips, and the third group of LED chips is physically arranged in parallel to each other.

In some embodiments, the LED filament assembly further includes a fourth group of LED chips capable of emitting white light, and the fourth group of LED chips is also disposed on the frame along the longitudinal axis, connected in series, and electrically connected to the first electrode and the second electrode.

In some embodiments, the first group of LED chips, the second group of LED chips, the third group of LED chips, and the fourth group of LED chips is physically arranged in parallel to each other.

In some embodiments, the frame includes a first layer, a second layer, a third layer, and a fourth layer. In addition, the first group of LED chips is disposed on the first layer, the second group of LED chips is disposed on the second layer, the third group of LED chips is disposed on the third layer, and the fourth group of LED chips is disposed on the fourth layer.

In some embodiments, the first electrode and the second electrode are capable of providing a first power to the first group of LED chips, a second power to the second group of LED chips, a third power to the third group of LED chips, and a fourth power to the fourth group of LED chips so as to enable the first group of LED chips, the second group of LED chips, the third group of LED chips and the fourth group of LED chips to emit light with different luminance.

In some embodiments, the LED filament assembly further comprises a transmissive tape wrapping the first group, the second group, and the third group of LED chips.

In some embodiments, the transmissive coating includes silicon gel.

In some embodiments, the transmissive coating includes silicon gel and diffusion powder.

In some embodiments, the frame includes a first layer, a second layer, and a third layer, the first group of LED chips is disposed on the first layer, the second group of LED chips is disposed on the second layer, and the third group of LED chips is disposed on the third layer.

In some embodiments, the first electrode and the second electrode are capable of providing a first power to the first group of LED chips, a second power to the second group of LED chips, and a third power to the third group of LED chips to enable the first group of LED chips, the second group of LED chips, and the third group of LED chips to emit light with different luminance.

In some embodiments, the frame includes a flexible printed circuit board.

In some embodiments, the frame includes a polyimide film.

In some embodiments, the frame includes a plurality of ceramic films, each of the ceramic films is configured to have one of the first group of LED chips, one of the second group of LED chips, and one of the third LED chips installed thereon.

In some embodiments, the lamp with LED filament assembly includes a bulb housing, a head housing, and an LED filament assembly. The bulb housing has an opening. The head housing has a first end connected to the opening of the bulb housing and a second end configured for connecting to an electrical socket for receiving power. The LED filament assembly is electrically connected to the head housing and disposed inside the bulb housing. Particularly, the LED filament assembly includes a frame; a first group of LED chips capable of emitting a first color, a second group of LED chips capable of emitting a second color different from the first color, and a third group of LED chips capable of emitting a third color different from the first color and the second color. The first group of LED chips is disposed on the frame along a longitudinal axis, connected in series, and electrically connected to the first electrode and the second electrode. Similarly, the second group of LED chips is disposed on the frame along the longitudinal axis, connected in series in parallel to the first group of LED chips, and electrically connected to the first electrode and the second electrode. The third group of LED chips is also disposed on the frame along the longitudinal axis, connected in series in parallel to the first and second group of LED chips, and electrically connected to the first electrode and the second electrode.

In some embodiments, the frame includes a first layer, a second layer, and a third layer. The first group of LED chips is disposed on the first layer, the second group of LED chips is disposed on the second layer, and the third group of LED chips is disposed on the third layer.

In some embodiments, the LED filament assembly further includes a fourth group of LED chips capable of emitting white light. The fourth group of LED chips is disposed on the frame along the longitudinal axis, connected in series in parallel to the first, the second, and the third group of LED chips, and electrically connected to the first electrode and the second electrode.

In some embodiments, the LED filament assembly further comprises a transmissive tape wrapping the first group, the second group, and the third group of LED chips.

BRIEF DESCRIPTION OF DRAWINGS

For a better understanding of the present disclosure, its operating advantages and the specific objects attained by its uses, reference should be made to the accompanying drawings listed below. It is noted that these drawings are for illustration of preferred embodiments only and should not be regarded as limiting

DETAILED DESCRIPTION

Figure 1:
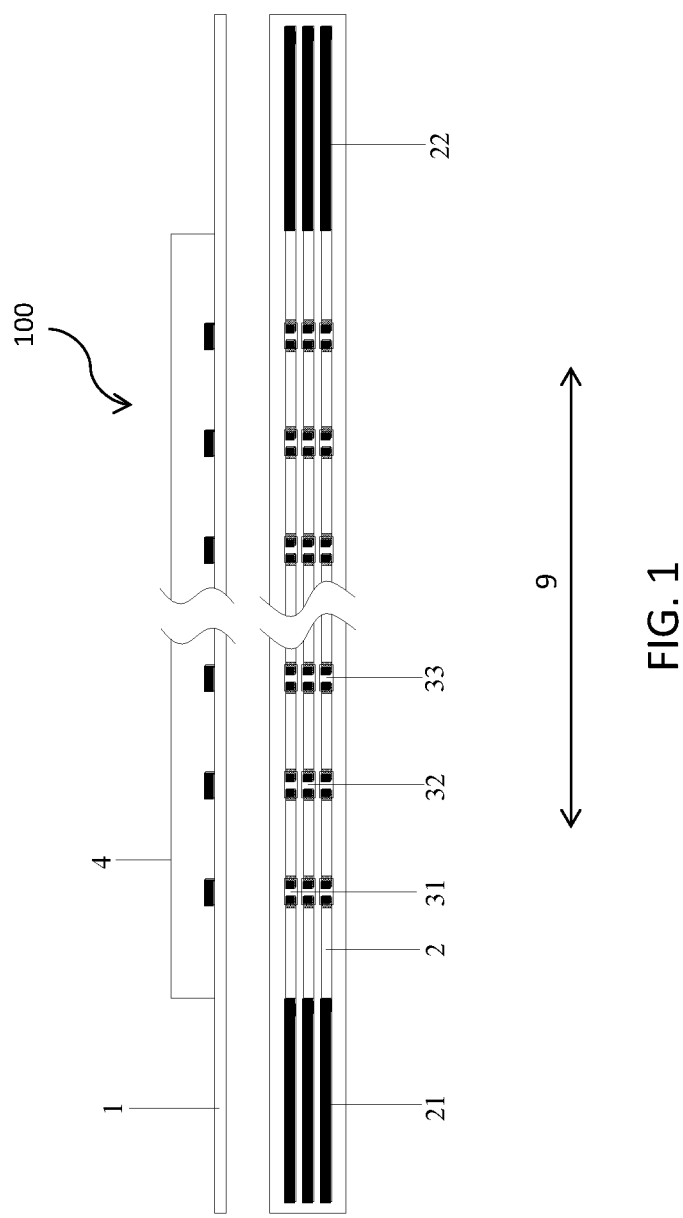
FIG. 1 is a schematic view of the LED filament in accordance with one embodiment of the present disclosure.

The present disclosure will be further described in detail below with reference to the accompanying drawings and embodiments. It is understood that the specific embodiments described herein are merely illustrative of the claimed invention and are not intended to limit the claimed invention.

The First Embodiment

In the first embodiment, the LED filament assembly 100 includes a frame 1, a first electrode 21 disposed on a first end of the frame, and a second electrode 22 disposed on a second end of the frame 1. The LED filament assembly 100 also includes a first group of LED chips 31 capable of emitting a first color, a second group of LED chips 32 capable of emitting a second color different from the first color, and a third group of LED chips 33 capable of emitting a third color different from the first color and the second color. The first group of LED chips 31 is disposed on the frame along a longitudinal axis 9, connected in series, and electrically connected to the first electrode 21 and the second electrode 22. Similarly, the second group of LED chips 32 is also disposed on the frame 1 along the longitudinal axis 9, connected in series, and electrically connected to the first electrode 21 and the second electrode 22. And the third group of LED chips 33 is also disposed on the frame 1 along the longitudinal axis 9, connected in series, and electrically connected to the first electrode 21 and the second electrode 22.

In this embodiment, the first group of LED chips 31 is capable of emitting red light, the second group of LED chips 32 is capable of emitting green light, and the third group of LED chips 33 is capable of emitting blue light. The first group, the second group, and the third group of LED chips are physically arranged along the strips 2, and physically arranged in parallel to each other. Each of the first group, the second group, and the third group of LED chips may be respectively enabled via the first electrode 21 and the second electrode 22. So the LED filament assembly 100 may generate light of different colors or color temperatures by enabling to one or a combination of the first group, the second group, and the third group of LED chips.

In this embodiment, each of the first group, the second group, and the third group of LED chips may be respectively provided with different voltages via the first electrode 21 and the second electrode 22 to generate light with different luminance. For example, the first group of LED chips 31 may be provided with a first voltage so as to generate light with a first luminance. The second group of LED chips 32 may be provided with a second voltage so as to generate light with a second luminance. The third group of LED chips 33 may be provided with a third voltage so as to generate light with a third luminance. With such arrangement, the LED filament 100 may generate light of different colors, different color temperatures, and different luminance.

In this embodiment, each of the strips 2 is arranged parallel to each other on the frame 1. The light sources (i.e., the LED chips) are arranged in a matrix on the frame 1. For example, the first group of LED chips 31 are arranged along a longitudinal axis 9 of the frame 1. Each of the first group of LED chips 31 is spaced apart from each other by a fixed distance. Along a lateral axis (vertical to the longitudinal axis 9) of the frame 1, each of the first group of LED chips 31, the second group of LED chips 32, and the third group of LED chips 33 is also arranged in parallel, and are spaced apart from each other by a fixed distance. In this way, the first color, the second color, and the third color uniformly constitute the light beams emitted from the LED filament assembly 100, and the brightness of the light beams may be configured accordingly.

Figure 2:
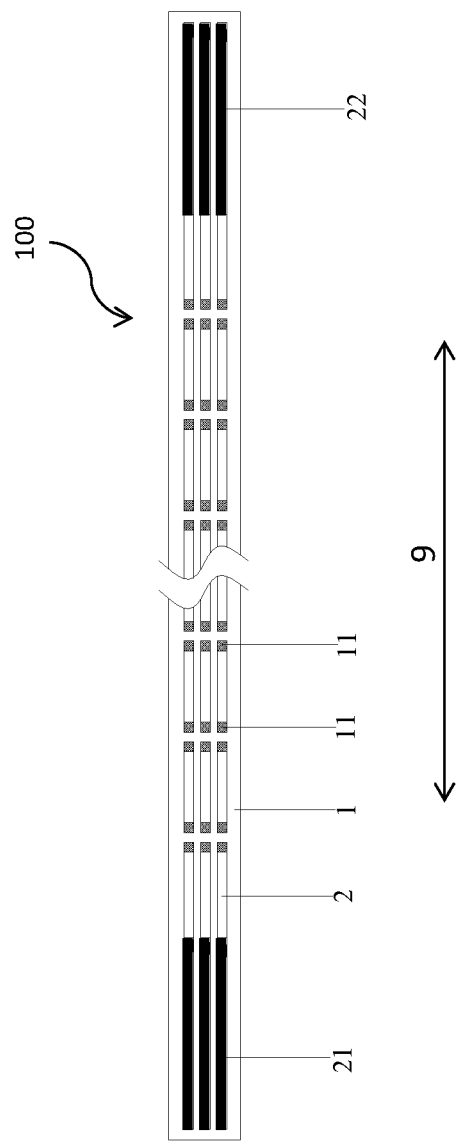
FIG. 2 is a schematic view of the substrate in FIG. 1.

Referring to FIG. 2, the first group of LED chips 31, the second group of LED chips 32, and the third group of LED chips 33 are LED flip-chips. Each of the LED flip-chips is configured with two solder pads 11 on the frame 1. The solder pads 11 are arranged in parallel along the longitudinal axis 9 of the frame 1. Specifically, the first group of LED chips 31 is realized by red LED flip-chips, the second group of LED chips 32 is realized by green LED flip-chips, the third group of LED chips 33 is realized by blue LED flip-chips.

In some embodiments, the group of LED chips for emitting red light (i.e., the red light source) may be realized by adopting blue LED flip-chips with red phosphor because the blue light may excite the red phosphor to generate the red light. In some embodiments, the group of LED chips for emitting green light (i.e., the green light source) may be realized by adopting blue LED flip-chips with green phosphors because the blue light may excite the green phosphors to generate the green light.

It is noted that in the embodiment where the red light source is realized by blue LED flip-chips with red phosphor, it is preferable that the green light source realized by green LED flip-chips is arranged between the blue light source and the red light source. Otherwise, the blue light emitting by the blue light source may inadvertently excite the red phosphor of the neighboring red light source to undesirably generate some red light. Therefore, in such embodiment, as an example, the first group of LED chips 31 is a red light source realized by blue LED flip-chips with red phosphor, the second group of LED chips 32 is a green light source realized by green LED flip-chips, and the third group of LED chips 33 is a blue light source realized by blue LED flip-chips.

Similarly, in the embodiment where the green light source is realized by blue LED flip-chips with green phosphor, it is preferable that the red light source realized by red LED flip-chips is arranged between the blue light source and the green light source. Otherwise, the light emitting by the blue light source may inadvertently excite the green phosphor of the neighboring green light source to undesirably generate some green light. Therefore, in such embodiment, as an example, the first group of LED chips 31 is a green light source realized by blue LED flip-chips with green phosphor, the second group of LED chips 32 is a red light source realized by red LED flip-chips, and the third group of LED chips 33 is a blue light source realized by blue LED flip-chips.

Briefly summarized, in the case where two groups of LED chips are realized by adopting the same color LED flip-chips but with different phosphors, it is preferable that these two groups of LED chips are separated by another group of LED chips realized by adopting a different color LED flip-chips so as to avoid interference from each other.

Figure 3:
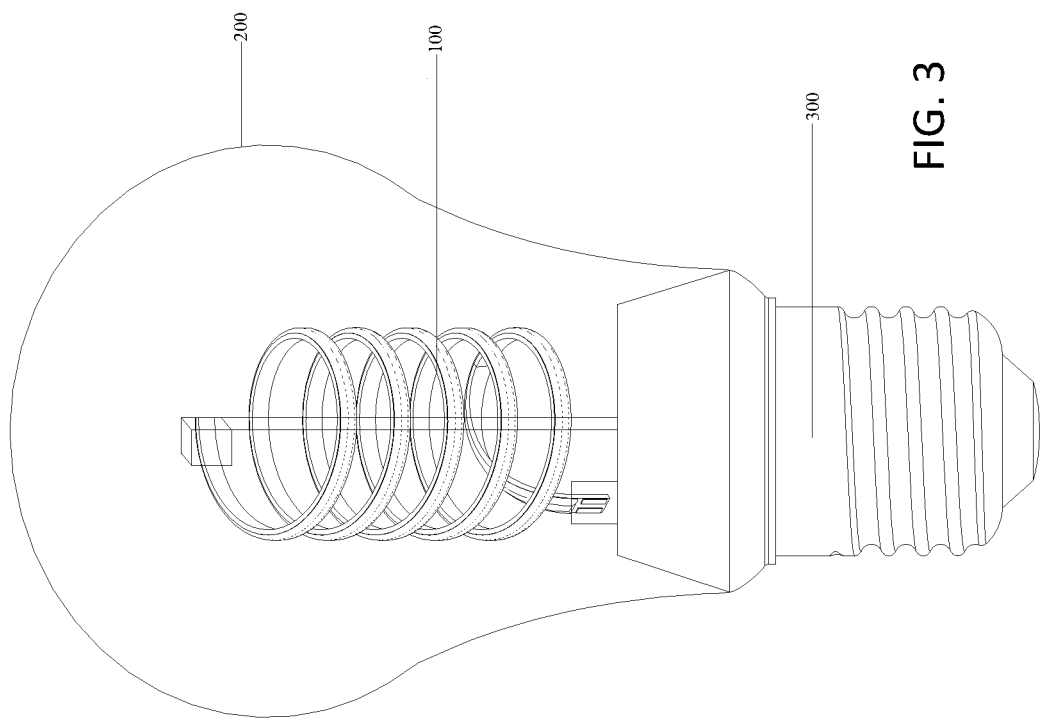
FIG. 3 is a schematic view of the bulb in accordance with a first embodiment of the present disclosure.

Referring to FIG. 3, a lamp includes a head housing 300, a bulb housing 200, and an LED filament 100. The bulb housing 200 connects to the head housing 300. The LED filament 100 is spiral and is arranged within the bulb housing 200. The LED filament 100 electrically connects to the head housing 300. In one embodiment, the frame 1 is a flexible printed circuit board. The frame 1 is configured with the transmissive tape 4 covering the light sources. Specifically, the transmissive tape 4 is made of silicon gel, or silicon gel with diffusion power. The diffusion powder is mixed with silicon gel to provide light transmissive opacity effect.

The Second Embodiment

Figure 4:
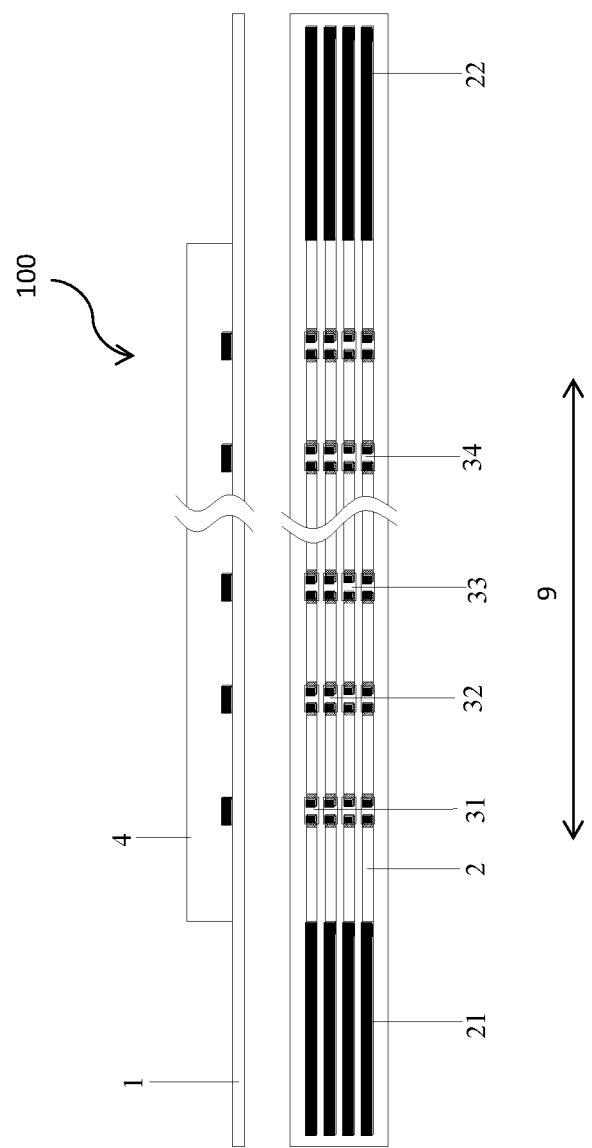
FIG. 4 is a schematic view of the LED filament in accordance with a second embodiment of the present disclosure.

Referring to FIG. 4, the difference between the LED filament 100 in the first embodiment and the second embodiment will be described hereinafter. The LED filament assembly 100 further includes a fourth group of LED chips 34 capable of emitting white light, and the fourth group of LED chips 34 is also disposed on the frame 1 along the longitudinal axis 9, connected in series, and electrically connected to the first electrode 21 and the second electrode 22.

The first group of LED chips 31, the second group of LED chips 32, the third group of LED chips 33, and the fourth group of LED chips 34 are physically arranged in parallel to each other.

The first group of LED chips 31 is capable of emitting red light, the second group of LED chips 32 is capable of emitting green light, the third group of LED chips 33 is capable of emitting blue light, and the fourth group of LED chips 34 is capable of emitting white light.

In some embodiments, the group of LED chips for emitting red light (i.e., the red light source) may be realized by adopting blue LED flip-chips with red phosphor, the group of LED chips for emitting green light (i.e., the green light source) may be realized by adopting blue LED flip-chips with green phosphors. The group of LED chips for emitting white light (i.e., the white light source) may be realized by adopting blue LED flip-chips with different phosphors to generate the red light, the green light, and the blue light, and then combining the red light, the green light, and the blue light to generate the white light. In the case where two groups of LED chips are realized by adopting the same color LED flip-chips but with different phosphors, it is preferable that these two groups of LED chips are separated by one or more groups of LED chips realized by adopting different color LED flip-chips so as to avoid interference from each other.

The first group, the second group, the third group, and the fourth group of LED chips are physically arranged along the strips 2, and are physically arranged in parallel to each other. Each of the first group, the second group, the third group, and the fourth group of LED chips may be respectively enabled via the first electrode 21 and the second electrode 22. So the LED filament assembly 100 may generate light of different colors or color temperatures by enabling to one or a combination of the first group, the second group, the third group, and the fourth group of LED chips.

Each of the first group, the second group, the third group, and the fourth group of LED chips may be respectively provided with different voltages via the first electrode 21 and the second electrode 22 to generate light with different luminance. For example, the first group of LED chips 31 may be provided with a first voltage so as to generate light with a first luminance. The second group of LED chips 32 may be provided with a second voltage so as to generate light with a second luminance. The third group of LED chips 33 may be provided with a third voltage so as to generate light with a third luminance. The fourth group of LED chips 34 may be provided with a fourth voltage so as to generate light with a fourth luminance. With such arrangement, the LED filament 100 may generate light of different colors, different color temperatures, and different luminance as desired.

In one embodiment, each of the strips 2 is arranged parallel to each other on the frame 1. The light sources (i.e., the LED chips) are arranged in a matrix on the frame 1. For example, the first group of LED chips 31 are arranged along the longitudinal axis 9 of the frame 1. Each of the first group of LED chips 31 is spaced apart from each other by a fixed distance. Along the lateral longitudinal axis (vertical to the longitudinal axis 9) of the frame 1, the first group of LED chips 31, the second group of LED chips 32, the third group of LED chips 33, and fourth group of LED chips 34 are also arranged in parallel, and are spaced apart from each other by a fixed distance. In this way, the first color, the second color, the third color, and the fourth color uniformly constitute the light beams emitted from the LED filament assembly 100, and the brightness of the light beams may be configured accordingly.

The Third Embodiment

Figure 5:
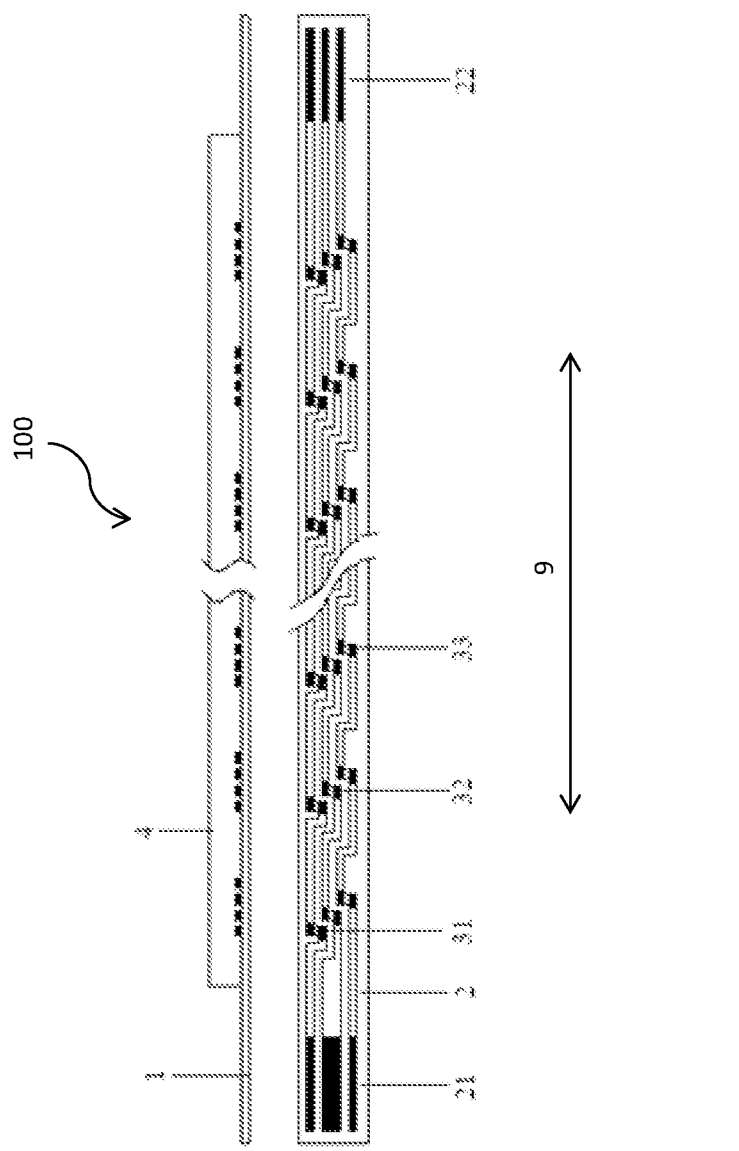
FIG. 5 is a schematic view of the LED filament in accordance with a third embodiment of the present disclosure.

Referring to FIG. 5, the difference between the LED filament 100 in the first embodiment and the third embodiment will be described hereinafter. In the third embodiment, each of the strips 2 is arranged parallel to each other on the frame 1. In addition, each of the strips 2 is spaced apart from each other by a fixed distance. The first, the second, and the third groups of LED chips on the strips 2 are sequentially arranged in an offset manner along the longitudinal axis 9 of the frame 1. In addition, the first group of LED chips 31, the second group of LED chips 32, and the third group of LED chips 33 are also arranged in the offset manner along the lateral axis (vertical to the longitudinal axis 9) of the frame 1. As such, along the longitudinal axis 9 of the frame 1, the colors of the LED chips are red, green, blue, and red . . . etc.

The first group of LED chips 31, the second group of LED chips 32, the third group of LED chips 33, and the fourth group of LED chips 34 are LED flip-chips. Each of the LED flip-chips on the frame 1 is configured with two solder pads 11. The solder pads 11 are arranged in parallel along the lateral axis of the frame 1.

The Fourth Embodiment

Figure 6:
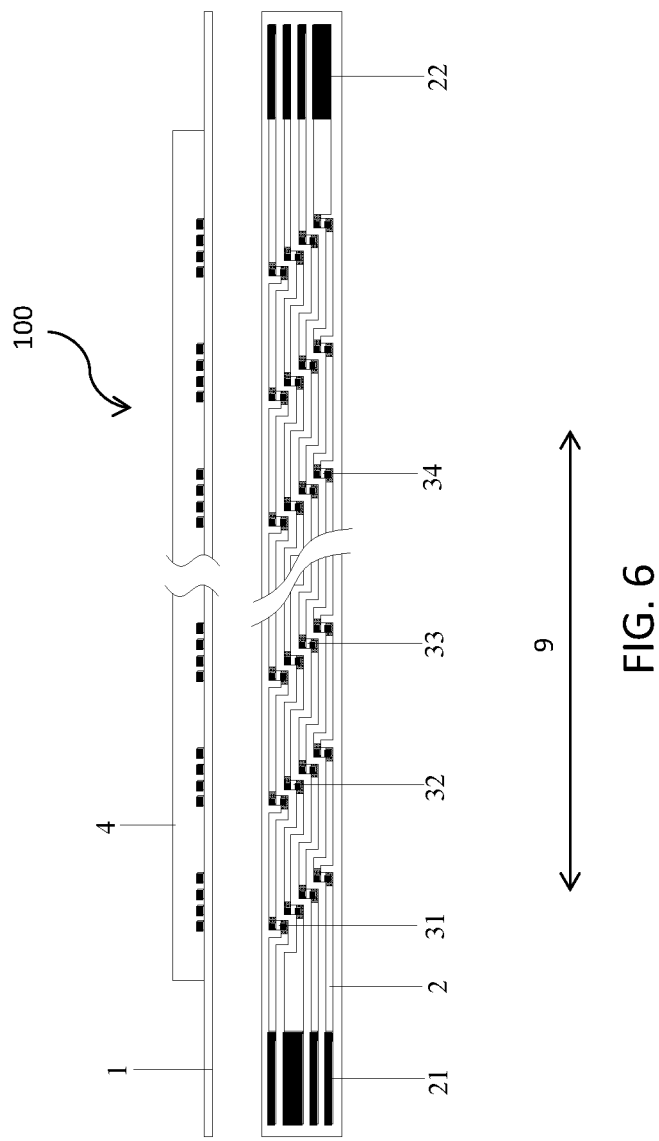
FIG. 6 is a schematic view of the LED filament in accordance with a fourth embodiment of the present disclosure.

Referring to FIG. 6, the difference between the LED filament 100 in the first embodiment and the fourth embodiment will be described hereinafter. In the embodiment, each of the strips 2 is arranged parallel to each other on the frame 1. In addition, each of the strips 2 is spaced apart from each other by a fixed distance. The first group, the second group, the third group, and the fourth group of LED chips on the strips 2 are sequentially arranged in an offset manner along the longitudinal axis 9 on the frame 1. The first group of LED chips 31, the second group of LED chips 32, the third group of LED chips 33, and the fourth group of LED chips 34 are also arranged in the offset manner along the lateral axis (vertical to the longitudinal axis 9) on the frame 1. As such, along the longitudinal axis 9, the colors of the LED chips are red, green, blue, red, white, red, . . . and so on.

The first group of LED chips 31, the second group of LED chips 32, the third group of LED chips 33, and the fourth group of LED chips 34 are LED flip-chips. Each of the LED flip-chips on the frame 1 is configured with two solder pads 11. The solder pads 11 are arranged in parallel along the lateral axis of the frame 1.

The Fifth Embodiment

Figure 7:
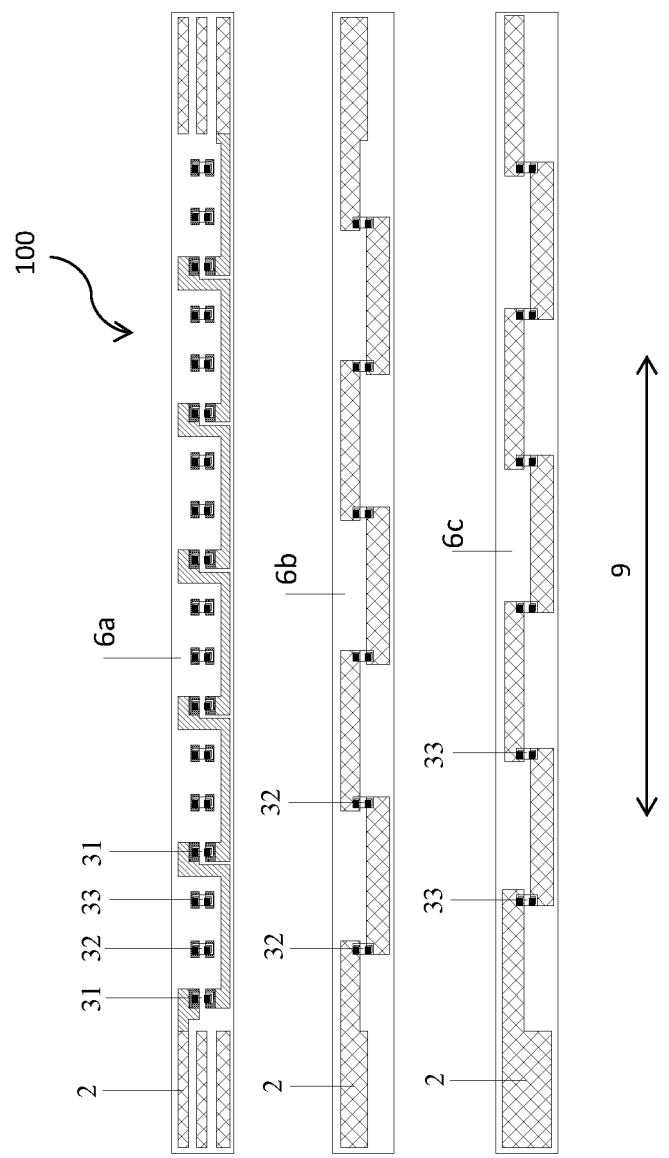
FIG. 7 is a schematic view of the LED filament in accordance with a fifth embodiment of the present disclosure.

Referring to FIG. 7, the difference between the LED filament 100 in the first embodiment and the fifth embodiment will be described hereinafter. In this embodiment, the frame 1 includes a flexible printed circuit board, e.g., a polyimide (PI) film. The flexible printed circuit board includes a first layer 6a, a second layer 6b, and a third layer 6c. The first group of red LED chips 31 is disposed on the first layer 6a, the second group of green LED chips 32 is disposed on the second layer 6b, and the third group of blue LED chips 33 is disposed on the third layer 6c. As shown in FIG. 7, the light sources (i.e. the LED chips) on the same layer along the longitudinal axis 9 are parallel to each other, and are spaced apart from each other by a fixed distance. The light sources (i.e. the LED chips) on different layers are sequentially offset from each other along the longitudinal axis 9.

Along a bottom-up direction, the first layer 6a includes copper pads for receiving the first group of red LED chips 31. A portion of the first layer 6a, which is not covered by the copper pads, is covered by a white covering film. Similarly, the second layer 6b includes copper pads for receiving the second group of green LED chips 32. A portion of the second layer 6b, which is not covered by the copper pads, is covered by a white covering film. Also similarly, the third layer 6c includes copper pads for receiving the third group of green LED chips 33. A portion of the third layer 6c, which is not covered by the copper pads, is covered by a white covering film.

The first layer 6a, the second layer 6b, and the third layer 6c are compressed together. The metallized holes are formed by drilling and electroplating processes, and the conductive common paths are formed between the different layers. The first layer 6a, the second layer 6b, and the third layer 6c are adhered to the substrate 1 by adhesive materials.

The Sixth Embodiment

Figure 8:
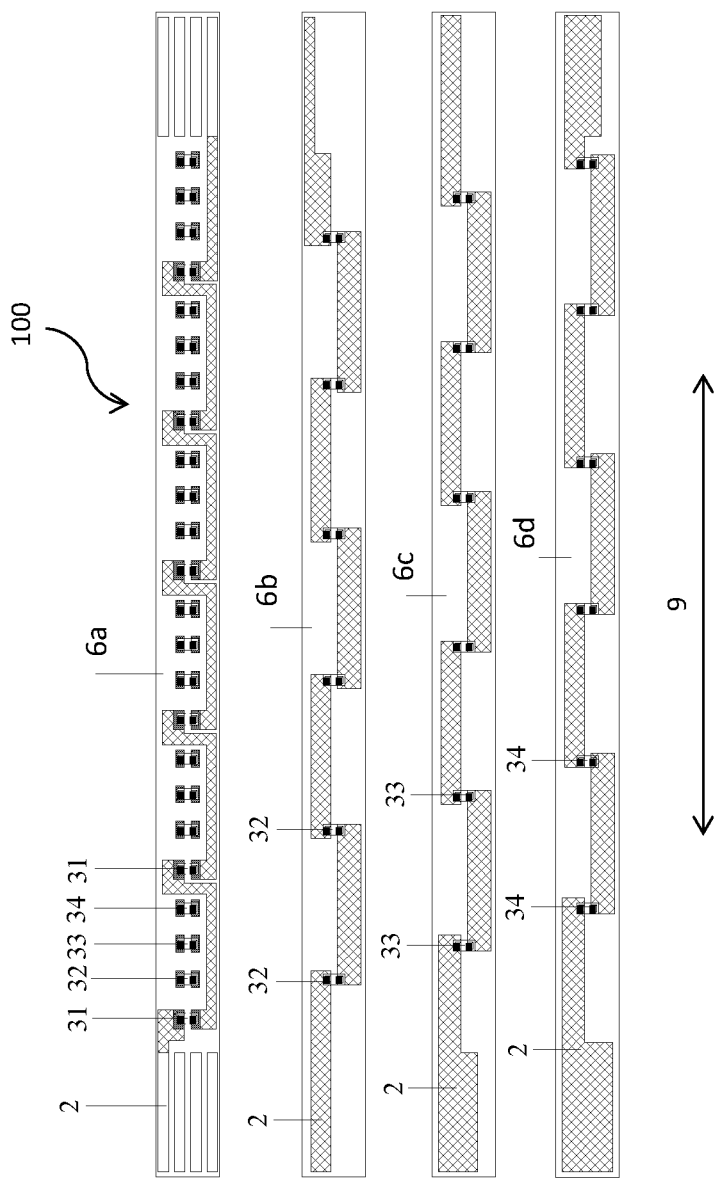
FIG. 8 is a schematic view of the LED filament in accordance with a sixth embodiment of the present disclosure.

Referring to FIG. 8, the difference between the LED filament 100 in the second embodiment and the sixth embodiment will be described hereinafter. In this embodiment, the frame 1 includes a flexible printed circuit board, e.g., a polyimide (PI) film. The flexible printed circuit board includes a first layer 6a, a second layer 6b, a third layer 6c, and a fourth layer 6d. The first group of red LED chips 31 is disposed on the first layer 6a, the second group of green LED chips 32 is disposed on the second layer 6b, the third group of blue LED chips 33 is disposed on the third layer 6c, and the fourth group of white LED chips 34 is disposed on the fourth layer 6d. As shown in FIG. 8, the light sources (i.e. the LED chips) on the same layer along the longitudinal axis 9 are parallel to each other, and are spaced apart from each other by a fixed distance. The light sources (i.e. the LED chips) on different layers are sequentially offset from each other along the longitudinal axis 9. Along a bottom-up direction, the first layer 6a includes copper pads for receiving the first group of red LED chips 31. A portion of the first layer 6a, which is not covered by the copper pads, is covered by a white covering film. The second layer 6b includes copper pads for receiving the second group of green LED chips 32. A portion of the second layer 6b, which is not covered by the copper pads, is covered by white covering film. Also similarly, the third layer 6c includes copper pads for receiving the third group of green LED chips 33. A portion of the third layer 6c, which is not covered by the copper pads, is covered by white covering film. The fourth layer 6d includes copper pads for receiving the fourth group of green LED chips 34. A portion of the fourth layer 6d, which is not covered by copper pads, is also covered by the white covering film.

The first layer 6a, the second layer 6b, the third layer 6c, and the fourth layer 6d are compressed together. The metallized holes are formed by drilling and electroplating processes, and the conductive common paths are formed between the different layers. The first layer 6a, the second layer 6b, the third layer 6c, and the fourth layer 6d are adhered to the substrate 1 by adhesive materials.

The Seventh Embodiment

Figure 9:
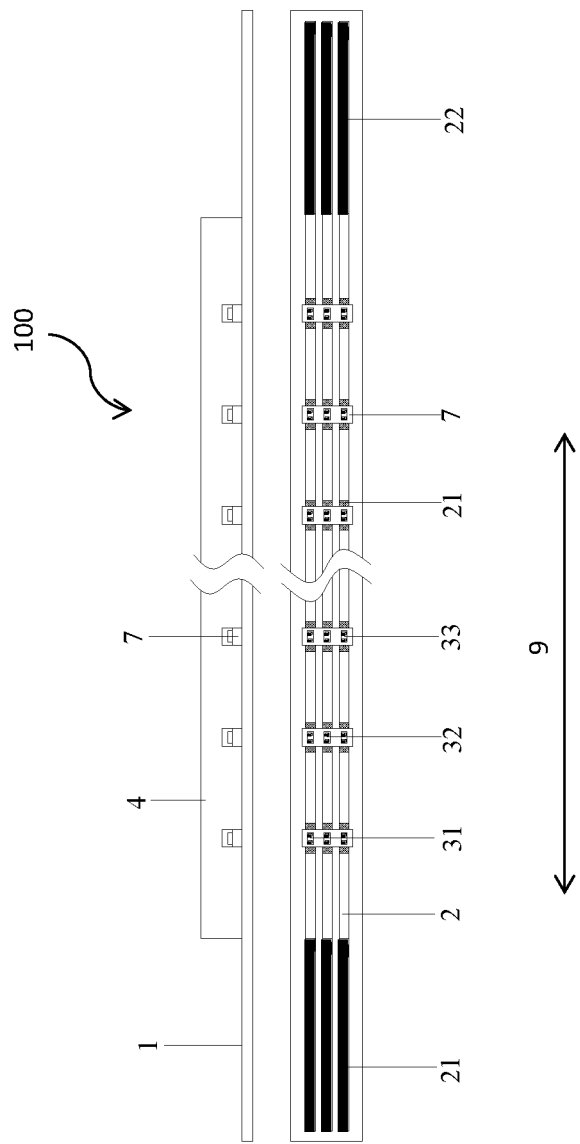
FIG. 9 is a schematic view of the LED filament in accordance with a seventh embodiment of the present disclosure.

Referring to FIG. 9, the difference between the LED filament 100 in the second embodiment and the seventh embodiment will be described hereinafter. In the embodiment, the frame 1 includes a plurality ceramic films 7. Each of the ceramic films 7 is arranged vertical to the longitudinal axis 9. One of the first group of LED chips 31, one of the second group of LED chips 32, and one of the third group of LED chips 33 are arranged on the same ceramic film 7. Each of the ceramic films 7 is configured to have a red LED chip 31, a green LED chip 32, and a blue LED chip 33 installed thereon. Each of the ceramic films 7 is also configured with a metal layer 8 for providing electrical connection for the red LED chip 31, the green LED chip 32, and the blue LED chip 33 to the frame 1.

Figure 10:
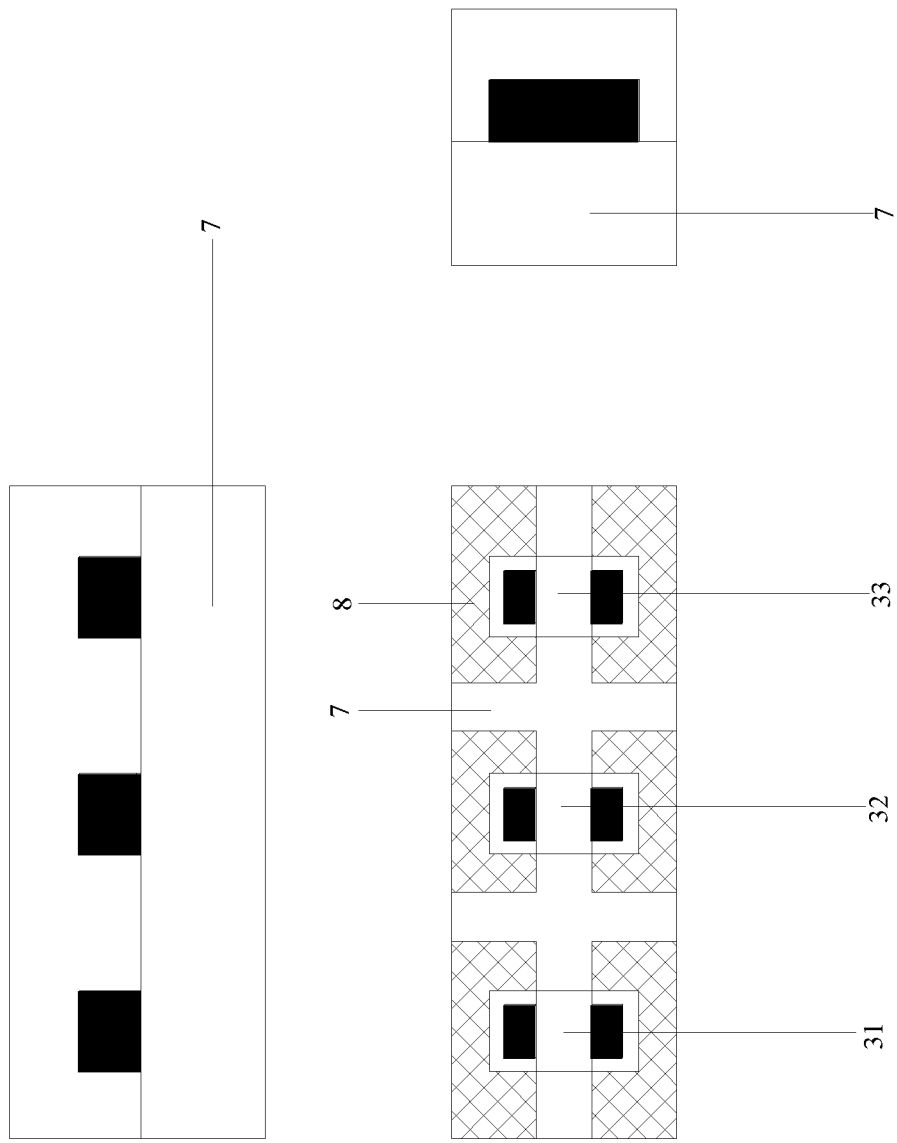
FIG. 10 is a schematic view of the ceramic plate and the light source on the ceramic plate in FIG. 9.

Referring to FIG. 10, the metal layer 8 is a silver layer. The ceramic film 7 includes a first side, a second side opposite to the first side, and a third side connecting the first side to the second side. The first side includes a first silver layer, the second side includes a second silver layer, and the third side includes a third silver layer. The first silver layer, the second silver layer, and the third silver layer respectively corresponds to the solder pads 11 located on the frame 1. The first silver layer is configured with the red LED chip, the green LED chip, and the blue LED chip. The third silver layer connects between the first silver layer and the second silver layer. The first silver layer adheres to the frame 1.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

We claim:

1. A LED filament assembly, comprising:
a frame;
a first electrode disposed on a first end of the frame;
a second electrode disposed on a second end of the frame;
a first group of LED chips capable of emitting a first color, the first group of LED chips is disposed on the frame along a longitudinal axis, connected in series, and electrically connected to the first electrode and the second electrode;
a second group of LED chips capable of emitting a second color different from the first color, the second group of LED chips is disposed on the frame along the longitudinal axis, connected in series, and electrically connected to the first electrode and the second electrode;
a third group of LED chips capable of emitting a third color different from the first color and the second color, the third group of LED chips is disposed on the frame along the longitudinal axis, connected in series, and electrically connected to the first electrode and the second electrode, wherein the frame includes a plurality of ceramic films, each of the ceramic films is configured to have one of the first group of LED chips, one of the second group of LED chips, and one of the third LED chips installed thereon.

2. The LED filament assembly of claim 1, wherein the first group of LED chips is capable of emitting red light, the second group of LED chips is capable of emitting green light, and the third group of LED chips is capable of emitting blue light.

3. The LED filament assembly of claim 1, wherein the first group of LED chips and the third group of LED chips are realized by a first color LED flip-chips with different phosphors, and the second group of LED chips is realized by a second color LED flip-chips.

4. The LED filament assembly of claim 3, wherein the second group of LED chips is arranged between the first group of LED chips and the third group of LED chips.

5. The LED filament assembly of claim 4, wherein the first group of LED chips is realized by blue LED flip-chips with green phosphor, the second group of LED chips is realized by red LED flip-chips, and the third group of LED chips 33 is realized by blue LED flip-chips.

6. The LED filament assembly of claim 1, wherein the first group of LED chips, the second group of LED chips, and the third group of LED chips is physically arranged in parallel to each other.

7. The LED filament assembly of claim 1, wherein the LED filament assembly further comprises a fourth group of LED chips capable of emitting white light, the fourth group of LED chips is disposed on the frame along the longitudinal axis, connected in series, and electrically connected to the first electrode and the second electrode.

8. The LED filament assembly of claim 7, wherein the first group of LED chips, the second group of LED chips, the third group of LED chips, and the fourth group of LED chips is physically arranged in parallel to each other.

9. The LED filament assembly of claim 7, wherein the fourth group of LED chips is disposed on the fourth layer.

10. The LED filament assembly of claim 7, wherein the first electrode and the second electrode are capable of providing a first power to the first group of LED chips, a second power to the second group of LED chips, a third power to the third group of LED chips, and a fourth power to the fourth group of LED chips to enable the first group of LED chips, the second group of LED chips, the third group of LED chips and the fourth group of LED chips to emit light with different luminance.

11. The LED filament assembly of claim 1, wherein the LED filament assembly further comprises a transmissive tape wrapping the first group, the second group, and the third group of LED chips.

12. The LED filament assembly of claim 11, wherein the transmissive tape includes silicon gel.

13. The LED filament assembly of claim 12, wherein the transmissive tape includes silicon gel and diffusion powder.

14. The LED filament assembly of claim 1, wherein the first electrode and the second electrode are capable of providing a first power to the first group of LED chips, a second power to the second group of LED chips, and a third power to the third group of LED chips to enable the first group of LED chips, the second group of LED chips, and the third group of LED chips to emit light with different luminance.

15. The LED filament assembly of claim 1, wherein the frame includes a flexible printed circuit board.

16. The LED filament assembly of claim 1, wherein the frame includes a polyimide film.

* * * * *